Oct. 17, 1967 W. S. BRYAN ET AL 3,347,720

METHOD OF FORMING A SEMICONDUCTOR BY MASKING AND DIFFUSION

Filed Oct. 21, 1965

INVENTOR.
WILLIAM S. BRYAN
BY GERALD S. WORCHEL

James M. Nickels

ATTORNEY

United States Patent Office 3,347,720 Patented Oct. 17, 1967

3,347,720

METHOD OF FORMING A SEMICONDUCTOR BY MASKING AND DIFFUSION

William S. Bryan, Deal, and Gerald S. Worchel, Eatontown, N.J., assignors to The Bendix Corporation, a corporation of Delaware Filed Oct. 21, 1965, Ser. No. 500,071
6 Claims. (Cl. 148—187)

Figure 1:
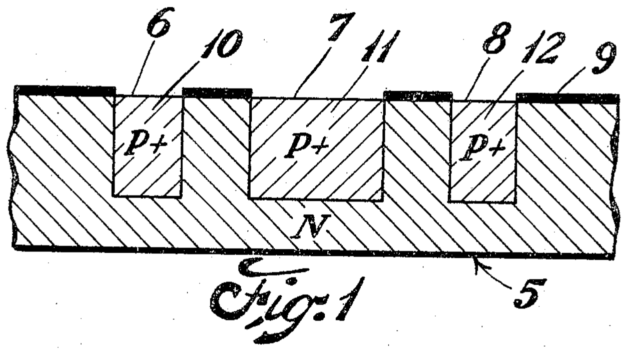

The present invention relates to semiconductor devices and more particularly to a method of making a high frequency power transistor.

In the past, many elaborate and sometimes complex methods have been devised to increase the frequency response of planar power transistors. In designing transistors for maximum frequency response, the primary objective is to minimize the emitter junction capacitance consistent with the allowable current rating and decrease the base transit time consistent with the allowable voltage rating. The base transit time is decreased by maintaining, through diffusion, very thin base widths. Reduction in emitter junction capacitance has been obtained by the use of smaller and smaller emitter areas while maintaining emitter periphery. One of the present techniques is the emitter overlay principal in which many small emitters are tied together in parallel.

The present invention involves reducing the emitter junction area, thereby decreasing emitter junction capacitance, by a sequence of impurity diffusion utilizing the different levels of concentration of impurities to control the rate of diffusion.

It is an object of the invention to provide an improved semiconductor device.

Another object of the invention is to provide a high frequency power transistor.

Another object of the invention is to provide a novel method for fabricating a semiconductor device.

Another object of the invention is to provide improved means for increasing the frequency response of a transistor.

The above and other object and features of the invention will appear more fully hereinafter from a consideration of the following description taken in connection with the accompanying drawings, wherein one embodiment is illustrated by way of example.

Figure 2:
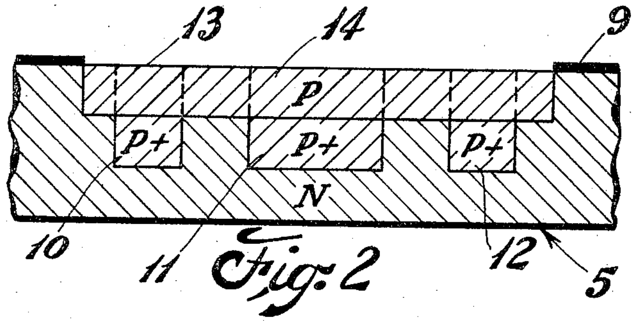
Figure 3:
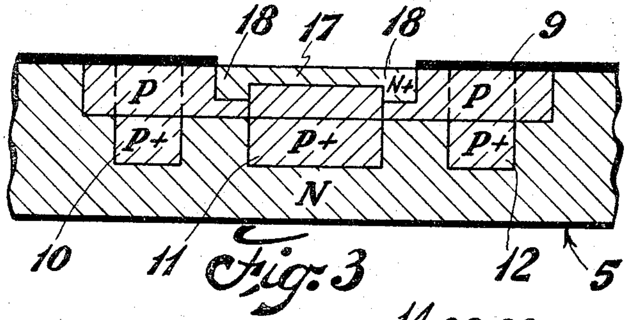
Figure 4:
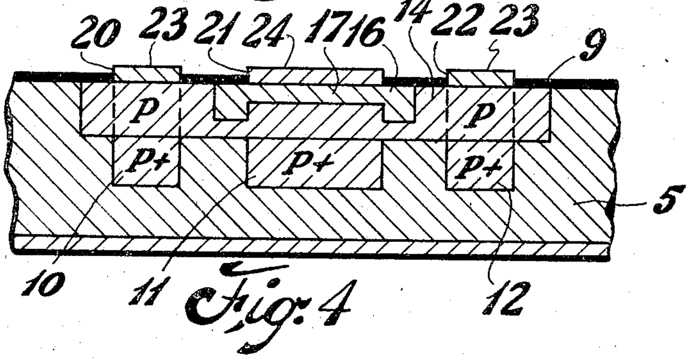

In the drawing:

FIGURES 1, 2, and 3 are diagrammatical presentations illustrating steps of the invention. FIGURE 4 is a diagrammatical cross section of a device embodying the invention.

Referring now to FIGURE 1 of the drawing. A wafer of semiconductor material is indicated by the numeral 5 and for the purpose of illustration may be N type silicon. By proper masking in conjunction with photo resist openings 6, 7, and 8 are made in an oxide coating 9 on the wafer 5. An impurity, which for the purpose of illustration may be boron, is diffused through the openings 6, 7, and 8 into the wafer 5 to form P+ areas 10, 11, and 12.

Next, see FIGURE 2. By proper masking and photo resist, an opening 13 is formed in the oxide 9 and additional boron is then diffused into the wafer 5 to form a P area 14. After regrowing the oxide layer 9, another opening 15 (see FIGURE 3) is made by masking and photo resist technique in the oxide layer 9. An impurity of the N type, for example phosphorous, is diffused through the opening 15 to form an N+ area 16.

During the diffusion, the phosphorous diffuses at a greater rate in the areas where only the P diffusion has been made than in the areas 10, 11, and 12, which have a higher concentration of impurities. Thus, the N+ area

16 will have a relatively thin section 17 and thicker sections 18. The area 16 which forms the emitter and is effectively a strip with the active area being that under the sections 18 of the area 16. This reduction in effective area reduces the input capacitance thereby increasing the frequency response of the device. High level current injection is inhanced by the increase in emitter periphery due to the edges of the sections 18.

Referring now to FIGURE 4, the wafer 5 is mounted on a conductive member 19 which forms the collector ohmic contact. By masks and photo resist methods, openings 20, 21, and 22 are formed in the regrown oxide layer 9. Base contacts 23 and emitter contact 24 are deposited through the openings 20, 21, and 22, for example by evaporating aluminum. The base contacts 23 are made to the areas 10 and 12 and the emitter contact to the area 17 of the emitter 16.

Although only one embodiment of the invention has been illustrated and described, various changes in the form and relative arrangement of the parts, which will now appear to those skilled in the art, may be made without departing from the scope of the invention.

What is claimed is:

1. A method of making a semiconductor device comprising the steps of masking and providing openings in the mask on a wafer of a predetermined type of conductivity, diffusing impurities of an opposite type conductivity in predetermined locations to a predetermined depth, a second masking and providing an opening and diffusing an additional amount of said opposite type impurities to overlap said first diffusion and to a depth less than said first diffusion, and a third masking and providing openings and diffusing an impurity of said predetermined type of conductivity to overlap one of said first diffusing and to a depth less than said second diffusing.

2. The combination as set forth in claim 1 in which said predetermined type of conductivity is N type and said opposite type is P type.

3. The combination as set forth in claim 1 in which said wafer is silicon.

4. The combination as set forth in claim 1 in which said masking is silicon oxide.

5. The combination as set forth in claim 1 and including a fourth masking and providing openings and depositing contacts on said wafer.

6. A method of making a transistor comprising the steps of:
   - growing an oxide layer on a N type silicon wafer,
   - etching to provide predetermined openings spaced a predetermined distance apart,
   - diffusing a P type impurity through said openings into said wafer to a predetermined depth,
   - reopening the oxide to provide an opening extending over and beyond said first openings,
   - diffusing a P type impurity through said opening and said wafer to a depth less than said first diffusion,
   - regrowing said oxide,
   - reopening said oxide to form an opening overlapping one of said first diffused areas,
   - diffusing a N type impurity into said wafer to form an emitter.

References Cited

UNITED STATES PATENTS

| | | | |
|---|---|---|---|
| 3,144,366 | 8/1964 | Rideout et al. | 148—187 |
| 3,183,128 | 5/1965 | Leistiko et al. | 148—187 |
| 3,184,823 | 5/1965 | Little et al. | 148—187 |

HYLAND BIZOT, *Primary Examiner.*